(12) United States Patent
Kim

(10) Patent No.: US 6,555,867 B1
(45) Date of Patent: *Apr. 29, 2003

(54) FLASH MEMORY GATE COUPLING USING HSG POLYSILICON

(75) Inventor: Unsoon Kim, Santa Clara, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 735 days.

(21) Appl. No.: 08/991,448

(22) Filed: Dec. 16, 1997

(51) Int. Cl.[7] .................. H01L 29/788; H01L 29/76; H01L 29/94; H01L 31/062
(52) U.S. Cl. .................. 257/315; 438/257; 365/185.33; 257/397
(58) Field of Search .................. 257/315, 317, 257/397; 438/257; 365/185.33

(56) References Cited

U.S. PATENT DOCUMENTS

| | | | | |
|---|---|---|---|---|
| 4,855,800 A | * | 8/1989 | Esquivel et al. | 257/397 |
| 5,229,631 A | * | 7/1993 | Woo | 257/314 |
| 5,278,438 A | * | 1/1994 | Kim et al. | 257/316 |
| 5,753,559 A | * | 5/1998 | Yew et al. | 438/398 |
| 5,768,186 A | * | 6/1998 | Ma | 365/185.01 |
| 5,879,989 A | * | 3/1999 | Lim | 438/257 |

OTHER PUBLICATIONS

Shirai et al., "A 0.54 micron–sq Self–Aligned, HSG Floating Gate Cell (SAHF Cell) for 256Mbit Flash Memories", IEDM 95, pp. 653–6, Dec. 1995.*

Shirai et al., "A 0.54 micron–sq Self–Aligned, HSG Floating Gate Cell (SAHF Cell) for 256Mbit Flash Memories", IEDM 95, pp. 653–6.

* cited by examiner

*Primary Examiner*—Wael Fahmy
*Assistant Examiner*—Howard Weiss
(74) *Attorney, Agent, or Firm*—LaRiviere, Grubman & Payne, LLP

(57) ABSTRACT

A method for improving the gate coupling in a flash memory core includes forming floating gates of memory element stacks by depositing a first polysilicon layer having relatively small grain size on a tunnel oxide layer and then depositing a second polysilicon layer on the first, the second polysilicon layer being made of relatively large hemispherical-grained (HSG) polysilicon crystals, which improves gate coupling. In contrast, owing to the relatively small size of its grains, the first layer of polysilicon advantageously establishes a relatively flat surface interface with the tunnel oxide layer that is between the memory stacks and the underlying silicon substrate. Conventional control gates are then established above the HSG layer.

6 Claims, 4 Drawing Sheets

FLASH MEMORY GATE COUPLING USING HSG POLYSILICON

TECHNICAL FIELD

The present invention relates generally to computer flash memory systems, and more particularly to systems and methods for improving the gate coupling in flash memory elements.

BACKGROUND OF THE INVENTION

Computer non-volatile (flash) memory chips such as electrically programmable read only memory (EPROM) chips are used in many applications, including hand held computing devices, wireless telephones, and digital cameras. In computer flash memory, a flash memory core containing a matrix of memory elements is surrounded by a periphery containing peripheral elements. The elements in the core assume physical states which represent bits of data. Consequently, by configuring the core elements appropriately, data (such as preselected telephone numbers in a wireless telephone or digital images in a digital camera) may be stored in the core and subsequently read by detecting the physical state of one or more core elements.

To enable the individual memory elements of a flash memory chip to maintain the physical state with which they have been programmed, each element must be isolated from its neighboring elements. In the case of the peripheral elements, isolation is achieved by a method referred to in the art as local oxidation silicon, or "LOCOS". LOCOS isolation requires disposing a silicon oxide insulator between neighboring elements. While acceptable for isolating peripheral elements, however, LOCOS isolation is less than desirable for core element isolation. This is because it is desirable to minimize the distance between core elements to increase memory density, and the silicon in LOCOS isolation tends to encroach on the core memory elements, thereby decreasing core element (and, hence, memory) density.

Accordingly, a process that renders closely spaced memory core elements, referred to in the art as "self-aligned" elements, has been developed. Self-aligned memory core elements are isolated from each other by shallow trenches that are etched into the silicon substrate of the core, between adjacent memory elements.

The memory elements between the trenches are established by one or more layers of polysilicon material, with the layers being aligned with each other and not overlapping the trenches. As recognized herein, two layers of polysilicon can be used in floating gate EPROM flash memory, with the use of two layers facilitating individual doping of each layer, thereby providing finer control of the doping of each memory element as compared to memory elements having only a single layer of polysilicon. When two layers of polysilicon material are to be used, an interpoly dielectric material is sandwiched between the two to separate the polysilicon layers. The top most polysilicon layer establishes a control gate for the memory element.

Regardless of the number of polysilicon layers used, the polysilicon material ordinarily used in flash memory is made of relatively small grained crystals. Indeed, the use of a type of large grained polysilicon material known as hemispherical-grained (HSG) polysilicon is avoided. This is because HSG polysilicon in the past has generally considered to be of insufficient quality for EPROM flash memory applications.

Nevertheless, in a paper entitled "A 0.54 $\mu m^2$ Self-Aligned, HSG Floating Gate Cell (SAHF Cell) for 256 Mbit Flash Memories" by Shirai et al. (IEDM 95-653, published by IEEE) (hereinafter "Shirai et al.") a flash memory having a single layer of polysilicon material made of HSG is disclosed for improving gate coupling. Thus, as taught in Shirai et al., the conventional small-grained polysilicon layer that establishes the floating gate of the memory element is eliminated and replaced with an HSG structure.

As recognized by the present invention, however, the large, irregularly-shaped grains taught by Shirai et al. do not establish a relatively flat, smooth bottom surface (i.e., the surface oriented toward the silicon substrate of the chip). This is unfortunate, because the bottom surface of a floating gate polysilicon layer must be positioned flush against a very thin tunnel oxide layer that is grown on the silicon substrate of the memory chip. Otherwise, the present invention understands that the tunnel oxide layer undesirably can be influenced by the HSG during subsequent thermal steps. Indeed, the single HSG layer of Shirai et al. diminishes the performance of the memory chip grain growth. Fortunately, as recognized by the present invention, an HSG polysilicon layer can be used in a flash memory device to improve gate coupling while providing for a flat, smooth interface between a tunnel oxide layer and a polysilicon layer.

Accordingly, it is an object of the present invention to provide a method and system for facilitating gate coupling in memory elements of a computer flash memory device. Another object of the present invention is to provide a method and system for facilitating gate coupling in memory elements of a computer flash memory device which establishes a relatively flat, smooth interface between a tunnel oxide layer in the device and a polysilicon layer in the device. Still another object of the present invention is to provide a method and system for facilitating gate coupling in memory elements of a computer flash memory device that is easy to use and cost effective.

BRIEF SUMMARY OF THE INVENTION

A process is disclosed for making a flash memory core. The process includes the steps of providing at least one silicon substrate and establishing plural stacks on the substrate. Each stack is positioned over a tunnel oxide layer that faces the substrate, and each stack includes at least one polysilicon layer above the tunnel oxide layer. At least one hemispherical-grained (HSG) layer is established above the polysilicon layer.

In one preferred embodiment, the step of establishing at least one HSG layer includes depositing the polysilicon layer on the tunnel oxide, and then depositing the HSG layer on the polysilicon layer. Next, the HSG layer is etched to partially overlap insulative material in isolation trenches. Then, an interpoly dielectric layer and a polysilicon "2" layer are deposited above the HSG layer to establish a control gate.

If desired, the method can further include forming isolation trenches between at least two stacks and forming at least one sidewall layer on at least some of the stacks. The sidewall layers protects the tunnel oxide during dry etching. The stacks can be self-aligned memory element stacks, in which case each stack can include the polysilicon layer on the tunnel oxide, a high temperature oxide layer on the polysilicon layer, and a nitride layer on the high temperature oxide layer.

Preferably, the method additionally includes disposing an insulative material in at least some of the trenches prior to the step of establishing at least one HSG layer. Furthermore, the preferred method includes the steps of polishing the insulative material down to the polysilicon layer, and, during the polishing step, removing the nitride layer and the high temperature oxide layer. A flash memory wafer made according to the present method, as well as a computing device incorporating the flash memory wafer, are also disclosed.

In another aspect of the present invention, a flash memory wafer includes a core memory region including at least one silicon substrate. Also, the flash memory wafer includes plural stacks in the core memory region, with each stack having at least one respective polysilicon layer on a tunnel oxide layer and at least one HSG layer above the polysilicon layer.

In still another aspect, a method for making a flash memory wafer includes establishing plural stacks on at least one silicon substrate. A tunnel oxide layer is disposed between each stack and the substrate, and each stack includes at least one polysilicon layer on the tunnel oxide layer. The method further contemplates establishing at least one HSG layer above the polysilicon layer in at least some of the stacks.

Other features of the present invention are disclosed or apparent in the section entitled: "DETAILED DESCRIPTION OF THE INVENTION".

BRIEF DESCRIPTION OF DRAWINGS

For fuller understanding of the present invention, reference is made to the accompanying drawing in the following detailed description of the Best Mode of Carrying Out the Present Invention. In the drawings.

Figure 1:
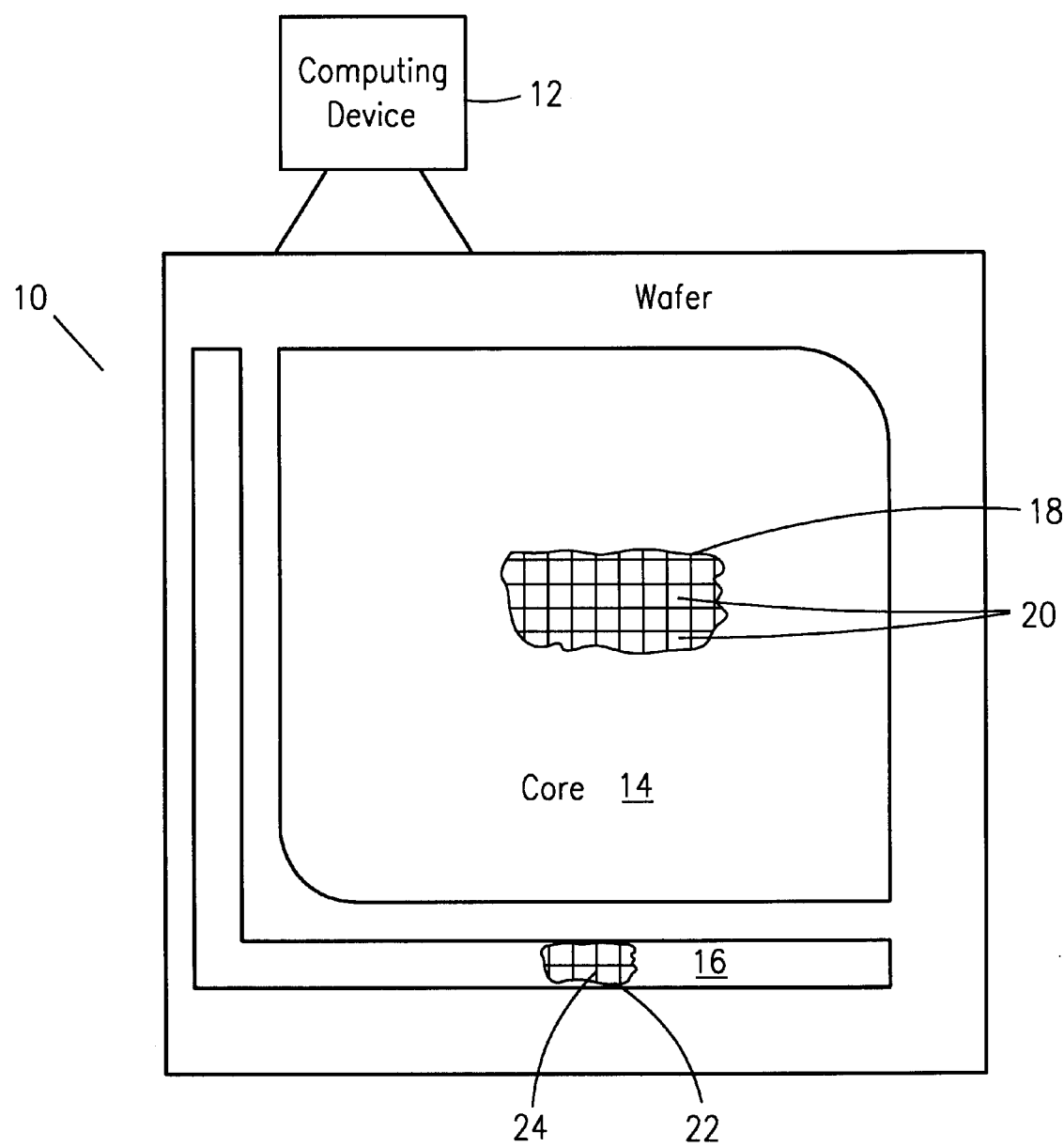
FIG. 1 is a schematic plan view of the present flash memory wafer in an exploded relationship with a computing device, with portions schematically cut away to show the memory elements.

Reference numbers refer to the same or equivalent parts of the present invention throughout the several figures of the drawing. In the description, the terms "vertical" and "horizontal" refer to the orientations of the figures shown, for purposes of disclosure, and do not necessarily refer to the orientation of the present wafer once the wafer is embodied in a computing device.

DETAILED DESCRIPTION OF THE INVENTION

Referring initially to FIG. 1, a flash memory wafer is shown, generally designated 10. The flash memory wafer 10 can establish any flash memory chip for use in the computer arts. In one preferred embodiment, the flash memory wafer can be an electrically programmable memory (EPROM). As shown in FIG. 1, the wafer 10 can be incorporated into a computing device 12, e.g., a digital camera, wireless telephone, or hand held computer, for use by the computing device 12.

FIG. 1 shows that the wafer 10 includes a core memory 14 and a periphery region 16 bounding at least a portion of the core memory 14. As can be appreciated in reference to FIG. 1, the core memory 14 includes a grid or matrix 18 of core memory elements 20, each of which must be isolated from its neighbors. Similarly, the periphery region 16 includes a grid or matrix 22 of peripheral memory elements 24, each of which must be isolated from its neighbors. In accordance with the present invention, the peripheral memory elements 24 can be isolated from each other using a so-called LOCOS method known in the art. On the other hand, to facilitate improved fabrication and closer spacing of core memory elements 20 (and, hence, higher memory capacity of the wafer 10), the core memory elements 20 are isolated from each other using a trench etching process disclosed herein.

Figure 2:
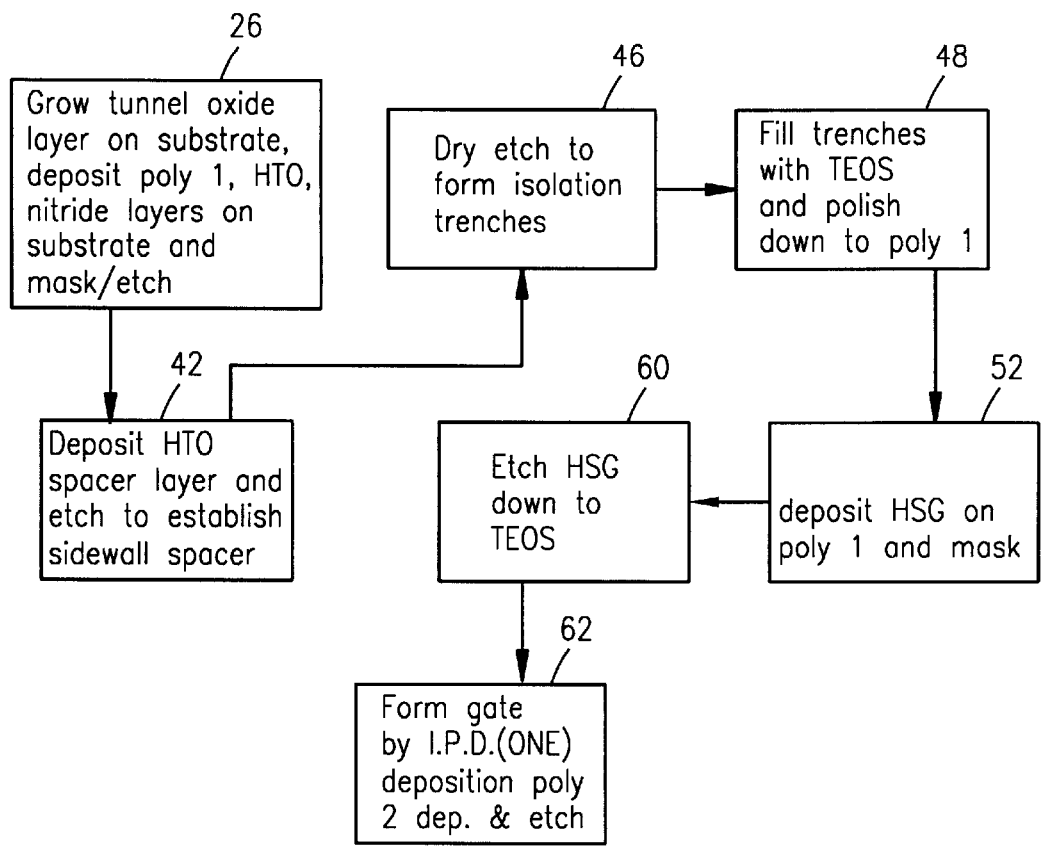
FIG. 2 is a flow chart of the present process.

FIG. 2 shows the novel fabrication process of the present invention. Commencing at block 26, memory element stacks are established on a silicon substrate. More particularly, a tunnel oxide layer is disposed on the silicon substrate (e.g., by growing the tunnel oxide layer), a polysilicon "1" layer is disposed on the tunnel oxide layer, a high temperature oxide layer is disposed on the polysilicon layer, and a nitride layer (such as silicon nitride, $Si_3N_4$) is disposed on the high temperature oxide layer. Then, a suitable photoresist layer is disposed on the nitride layer and exposed to ultraviolet light to establish a predetermined pattern in the photoresist layer, with the predetermined pattern being the desired isolation trench pattern of the wafer 10. The stacks are then established by dry etching through the various layers to the tunnel oxide layer on the silicon substrate.

Figure 3:
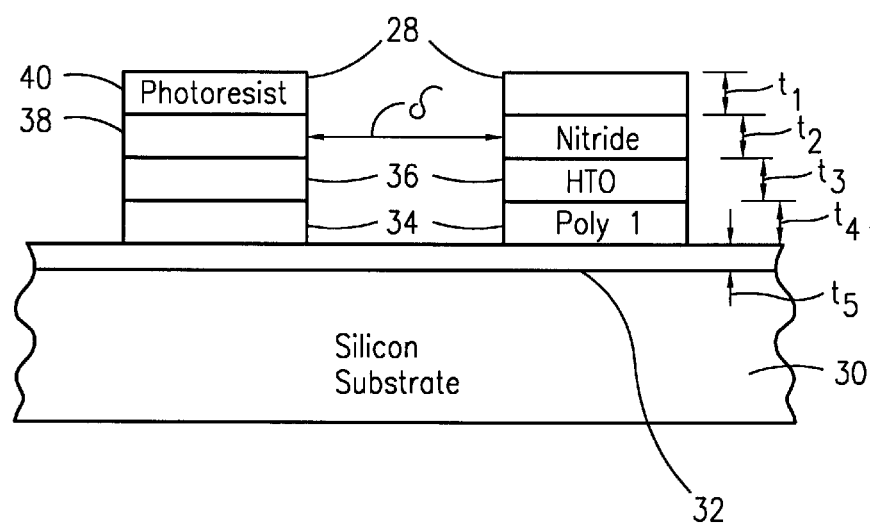
FIG. 3 is a schematic elevational view of a portion of the memory core from the bit line direction, after the stacks have been established on the silicon substrate and before removal of the photoresist mask layer.

The results of the above step are shown in FIG. 3. As shown, plural stacks 28, which in all essential respects are identical to each other in configuration, are disposed on a silicon substrate 30, with the distance δ between stacks (after etching) being about four tenths of a micron (0.4μ). Per the present invention, the core memory of the present invention is a self-aligned isolated memory.

With this in mind, each stack 28 that is established after etching includes a respective tunnel oxide layer 32 having a thickness "$t_5$" of about fifty Angstroms to two hundred Angstroms (50 Å–200 Å), with the tunnel oxide layers 32 being integrally formed with each other on the silicon substrate 30 by growing the layers 32 in accordance with principles known in the art. Also, each stack 28 includes a polysilicon "1" layer 34 on the tunnel oxide layer 32. The polysilicon "1" layers 34 have thicknesses "$t_4$" equal to about six hundred Angstroms to one thousand Angstroms (600 Å–1000 Å).

Moreover, each stack 28 includes a high temperature oxide (HTO) layer 36 on the respective polysilicon "1" layer 34, with the HTO layers 36 having thicknesses "$t_3$" equal to about one hundred Angstroms to two hundred Angstroms (100 Å–200 Å). The first HTO layers 36 can be CVD oxide layers. Additionally, each stack 28 includes a respective nitride layer 38 on the respective first HTO layer 36. The nitride layers 38 can be silicon nitride ($Si_3N_4$) layers having thicknesses "$t_2$" about equal to twelve hundred Angstroms to nineteen hundred Angstroms (1200 Å–1900 Å).

FIG. 3 also shows that on top of each nitride layer 38 is a photoresist mask layer 40. In accordance with self-aligned memory fabrication principles, the photoresist layer 40 is exposed to ultraviolet light to establish a pattern in the photoresist layer as appropriate for establishing a predetermined trench pattern in the silicon substrate 30. In other words, the photoresist layer 40 is exposed to light such that each stack 28 is protected by a respective portion of the photoresist layer 40, whereas the area above each intended isolation trench is not protected by the photoresist layer.

As mentioned above, the stacks 28 are then formed by dry etching to remove those portions of the oxide, nitride, and polysilicon layers that are directly beneath the trench pattern made in the photoresist layer. This dry etch process can be a plasma etch process using procedures known in the art. FIG. 3 shows the wafer 10 after the above-described dry etch process, before the remaining portions of the photoresist layer 40 have been removed subsequent to the dry etch.

Once the self-aligned stacks 28 of the present wafer 10 have been established at block 26, the process moves to block 42, wherein a high temperature oxide (HTO) sidewall layer is formed on the sides of each stack 28. In the preferred embodiment, the HTO sidewall layer is formed by depositing HTO over the wafer 10 and then etching the HTO such that only sidewall portions 44 (FIG. 4) of the HTO remain on the side walls of the stacks 28. Preferably, the HTO sidewall portions 44 have thicknesses "$t_6$" of about one hundred Angstroms to seven hundred Angstroms (100 Å–700 Å).

Figure 4:
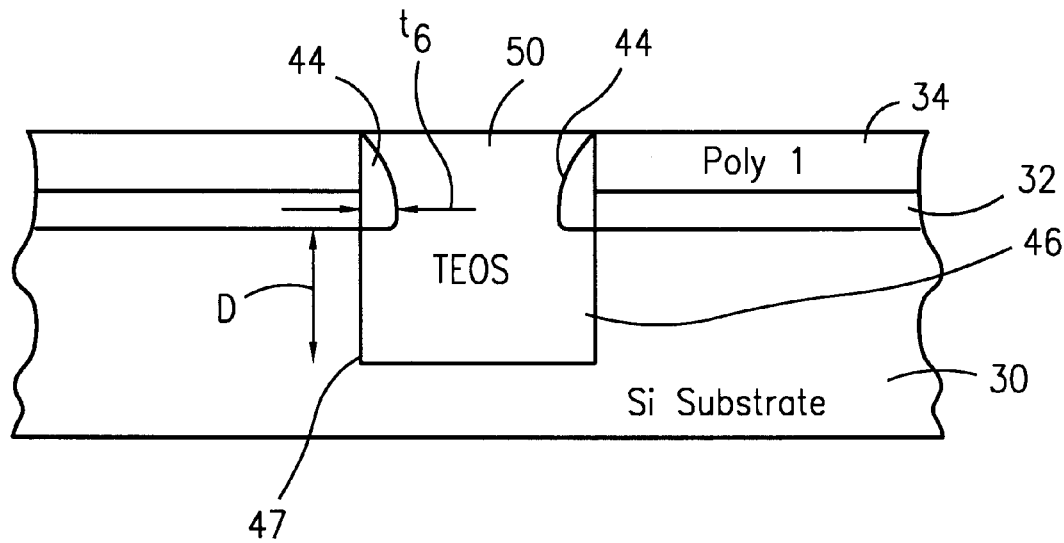
FIG. 4 is a schematic elevational view of a portion of the memory core from the bit line direction, after the trenches have been filled with TEOS and the TEOS polished down to the polysilicon "1" layer.

Moving to block 46 of FIG. 2 and referring to FIG. 4, isolation trenches 47 are formed between adjacent stacks 28 by dry etching to a depth "D" of between about two microns and four microns (0.2μ–0.4μ). If desired, a single etching process can be used to simultaneously etch both the sidewall portions 44 and the isolation trenches 47.

Then, at block 48 the trenches 47 and the spaces between stacks 28 above the trenches 47 are filled with an insulative material 50, preferably with TEOS or CVD oxide material. As can be appreciated in reference to FIG. 4, the insulative material is then polished down to the level of the polysilicon "1" layer 34 and the HTO layer 36 and nitride layer 38 removed during the polishing process. Preferably, chemical-mechanical polishing (CMP) is used during this step.

Figure 5:
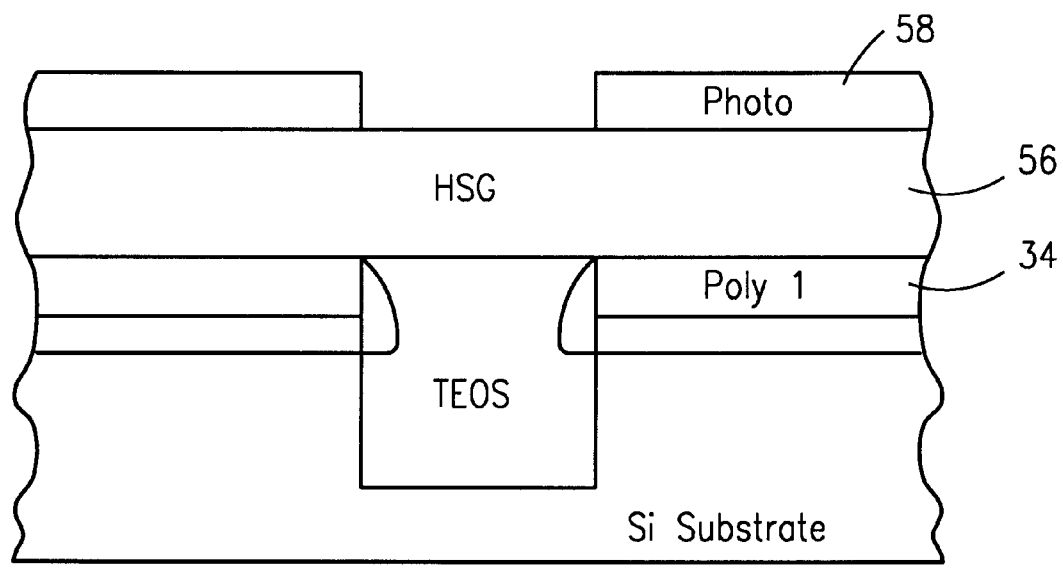
FIG. 5 is a schematic elevational view of a portion of the memory core from the bit line direction, after the photoresist layer has been exposed to light to establish a mask.

As indicated at block 52 and as shown in FIG. 5, the next step in the inventive process disclosed herein is to deposit a layer 56 of hemispherical-grain (HSG) polysilicon layer onto the polysilicon "1" layer 34. A photoresist layer 58 is deposited on the HSG layer 56 and exposed to light as appropriate to establish a mask as shown in FIG. 5.

Figure 6:
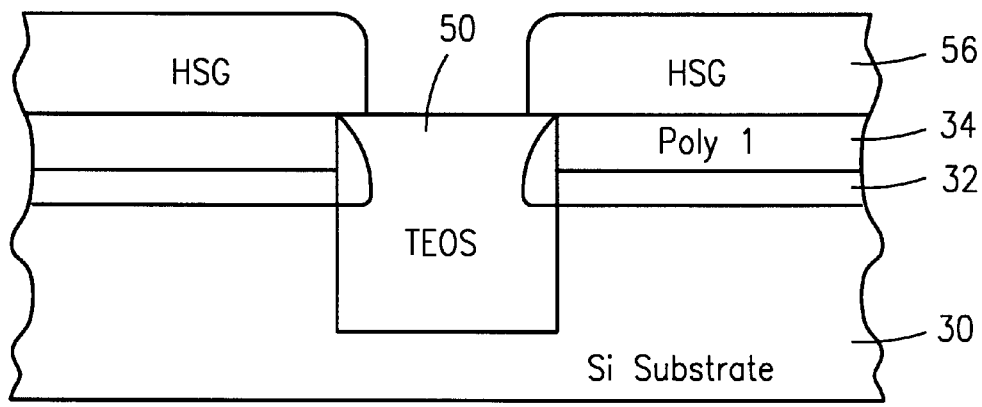
FIG. 6 is a schematic elevational view of a portion of the memory core from the bit line direction, after the HSG layer has been etched and the photoresist layer removed.

Proceeding to block 60 in FIG. 2 and considering FIG. 6 showing the results thereof, the portions of the HSG layer 56 that are directly above the insulative layer 50 are etched away to render the configuration shown in FIG. 6. As further shown in FIG. 6, the HSG layer 56 can partially overlap the insulative material 50 in isolation trenches 47. With this structure, each HSG layer of a respective memory stack 28 establishes a floating gate that exhibits relatively high gate coupling characteristics.

Figure 7:
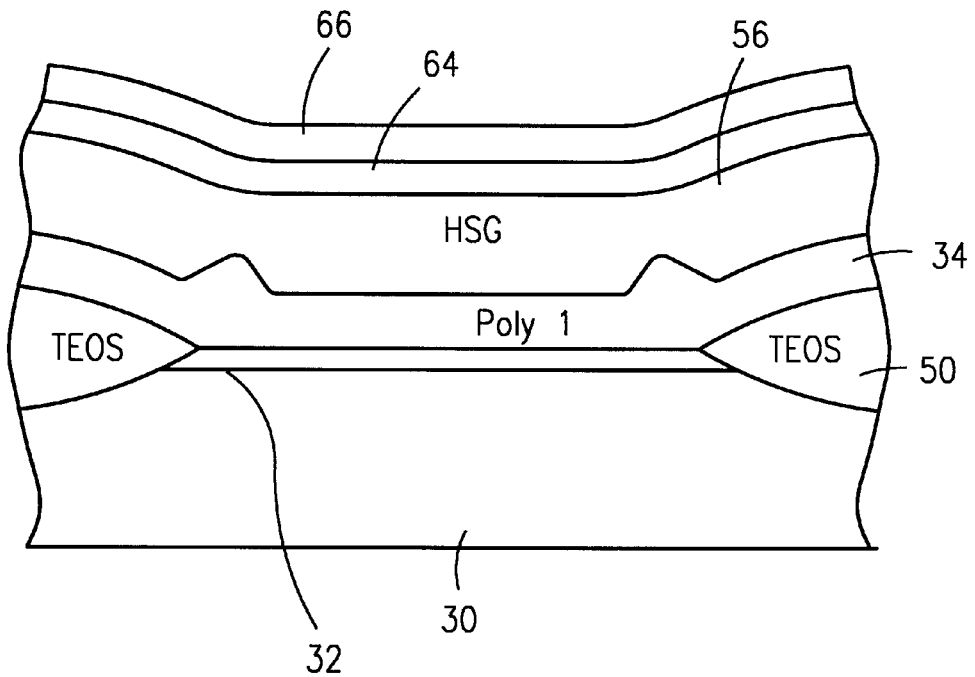
FIG. 7 is a schematic elevational view of a portion of the memory core from the word line direction, after the HSG layer has been etched and the photoresist layer removed and after the control gate polysilicon has been deposited.

The control gates of the memory elements are then conventionally established at block 62 of FIG. 2 by depositing an interpoly dielectric ("I.P.D.") layer 64 (FIG. 7), such as oxide-nitride-oxide ("ONO"), onto the HSG layer 56. Also, a polysilicon "2" layer 66 is deposited onto the interpoly dielectric layer 64 and then etched as appropriate to establish a control gate for an EPROM memory cell.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A flash memory wafer, comprising:
   a core memory region including at least one silicon substrate; and
   plural stacks in the core memory region, each stack having at least one respective polysilicon layer on a tunnel oxide layer and at least one HSG layer above the polysilicon layer each stack also having at least one sidewall layer, the HSG layer overlapping and contacting the sidewall layer.

2. The flash memory wafer of claim 1, further comprising:
   isolation trenches between at least some of the stacks; and
   an insulator disposed in at least some of the trenches.

3. The flash memory wafer of claim 2, further comprising an interpoly dielectric layer above the HSG layer.

4. The flash memory wafer of claim 3, wherein the HSG layer partially overlaps at least one trench.

5. The flash memory wafer of claim 1, in combination with a computing device.

6. A flash memory wafer, comprising:
   a core memory region including at least one silicon substrate; and
   plural stacks in the core memory region, each stack having at least one respective polysilicon layer on a tunnel oxide layer and at least one HSG layer above the polysilicon layer, each stack also having at least one sidewall layer below and in contact with the HSG layer.

* * * * *